US009100992B2

(12) United States Patent
Bobgan et al.

(10) Patent No.: US 9,100,992 B2
(45) Date of Patent: Aug. 4, 2015

(54) HEATER ASSEMBLY (71) Applicant: Minco Products, Inc., Minneapolis, MN (US)

(72) Inventors: Peter M. Bobgan, Maple Grove, MN (US); Timothy Robert DeBruin, Nowthen, MN (US)

(73) Assignee: Minco Products, Inc., Minneapolis, MN (US)

( * ) Notice: Subject to any disclaimer, the term of this patent is extended or adjusted under 35 U.S.C. 154(b) by 124 days.

(21) Appl. No.: 13/839,749

(22) Filed: Mar. 15, 2013

(65) Prior Publication Data

US 2014/0097176 A1   Apr. 10, 2014

Related U.S. Application Data (60) Provisional application No. 61/710,863, filed on Oct. 8, 2012.

(51) Int. Cl.
*H05B 3/68* (2006.01)
*H05B 3/26* (2006.01)
*H05B 3/72* (2006.01)
*H01L 21/67* (2006.01)
*H01L 21/687* (2006.01)

(52) U.S. Cl.
CPC .......... *H05B 3/262* (2013.01); *H01L 21/67103* (2013.01); *H01L 21/68785* (2013.01); *H05B 3/72* (2013.01)

(58) Field of Classification Search
CPC .................. H01L 21/67103; H01L 21/68785; H05B 3/20–3/262
USPC .......................................... 219/443.1–468.2
See application file for complete search history.

(56) References Cited

U.S. PATENT DOCUMENTS 6,035,101 A   3/2000  Sajoto et al.
6,072,163 A   6/2000  Armstrong et al.
(Continued)

FOREIGN PATENT DOCUMENTS

JP        09232240 A    9/1997
WO    WO-9628842 A1    9/1996

OTHER PUBLICATIONS

Choi, Hyun Goo, PCT International Search Report and Written Opinion of the International Searching Authority, PCT Application No. PCT/US2013/63687, Jan. 13, 2014.

(Continued)

*Primary Examiner* — Sang Y Paik
(74) *Attorney, Agent, or Firm* — Nawrocki, Rooney & Sivertson, P.A.

(57) ABSTRACT

An assembly suitable for controlling the temperature of a workpiece operatively engaged thereby is provided. The assembly generally comprises a housing characterized by first and second housing members sealingly united at their peripheries, and a heater cartridge enclosed within the housing and compressively retained interior of the sealingly united peripheries of the housing members. The heater cartridge comprises a heat conducting casing characterized by first and second heat conducting casing members and a composite heating element compressively retained between the heat conducting casing members. The first and second heat conducting casing members are selectively united interior of their peripheries so as to delimit heat conduits for the heater cartridge.

17 Claims, 5 Drawing Sheets

(56) References Cited

U.S. PATENT DOCUMENTS

| | | |
|---|---|---|
| 6,147,334 A | 11/2000 | Hannigan |
| 6,507,006 B1 | 1/2003 | Hiramatsu et al. |
| 7,199,337 B2 | 4/2007 | Torisawa |
| 7,265,324 B2 | 9/2007 | Ozawa et al. |
| 7,763,831 B2 | 7/2010 | Morioka et al. |
| 2004/0206747 A1 | 10/2004 | Ito |
| 2005/0205548 A1 | 9/2005 | Olding et al. |
| 2006/0157472 A1 | 7/2006 | Mashima et al. |
| 2006/0199135 A1 | 9/2006 | Mashima |
| 2006/0289447 A1 | 12/2006 | Mohamed |

OTHER PUBLICATIONS

Paik, Sang Y., PCT International Preliminary Report on Patentability, PCT Application No. PCT/US13/63687, Oct. 7, 2013.

HEATER ASSEMBLY

This is a United States national patent application filed pursuant to 35 USC §111(a) claiming priority under 35 USC §120 of/to U.S. Pat. Appl. Ser. No. 61/710,863 filed Oct. 8, 2012 and entitled COMPRESSED HEATER WITH HIGH CONDUCTIVITY HEAT SPREADERS, the disclosure of which is hereby incorporated by reference in its entirety.

TECHNICAL FIELD

The present invention generally relates to an apparatus/assembly suitable for controlling the temperature of a workpiece, e.g., a semiconductor wafer, more particularly, to a compressed heating assembly characterized by a heater cartridge having high conductivity heat spreaders encasing a heating element.

BACKGROUND OF THE INVENTION

Temperature is an important variable in many industrial processes. Most processes can operate effectively in a relatively wide temperature window. Some processes however require extremely precise and reliable temperature control.

For example, semiconductor fabrication requires tight temperature control on many processes. Semiconductor wafers must be maintained at high temperatures with a very uniform temperature profile across the wafer surface. Excessive temperature variability can result in process yield loss. Details with regard to such representative heating application are evidenced with reference to, among other things, Applicant's earlier work, namely, US Pub. No. US 2006/0289447 A1 entitled HEATING CHUCK ASSEMBLY, incorporated herein by reference in its entirety.

High temperature heating chucks, e.g., sandwiched pedestal assemblies, generally comprise two hermetically sealed metal (e.g., aluminum, stainless steel, nickel/nickel alloy) or ceramic discs which house a combination of elements or a subassembly, including, but not limited to a heater, and more often than not, a heater characterized by multiple, independently operable/controllable heating zones. Commonly, but not exclusively, heaters may be characterized by rods, wires, etched foils and/or etched foil laminates characterized by a dielectric, e.g., mica, ceramic paper, Kapton® polyimide, silicon rubber, etc., with such heater assemblies further characterized by combinations of sensors, controllers, cabling and other electrical and/or mechanical components, as well as tight dimensional tolerances, surface flatness, perpendicularity, and a select surface finish.

As is to be expected, temperature specifications and tolerances of heating chucks are a function of the wafer process, e.g., chemical vapor deposition (CVD), plasma enhanced chemical vapor deposition (PECVD), lithography, baking, plasma etching, cleaning, etc. Generally, thin flexible heaters or heating elements (e.g., Thermofoil™ etched foil heaters from Minco Products, Inc., MN, USA) are advantageously utilized in heating chuck assemblies. Characteristic heaters available for the semiconductor industry are generally twofold, namely, low temperature, i.e., up to about 260° C., rod-type, polyimide or ceramic heaters, or high temperature, i.e., up to about 600° C., rod-type, mica, or ceramic heaters.

Wafers whose diameters are 200 mm and 300 mm are most pervasive, with 450 mm wafers emerging, however, as heating chucks become larger, it becomes more difficult to control the thermal tolerances during wafer processing. As a result, problematic thermal warping of the heating chuck remains an issue.

The thermal process control of both the wafer and the heating chucks are critical to wafer processing as operating temperatures are generally controlling, e.g., operating temperatures dictate, among other things, reaction kinetics of the chemical reactions of the wafer process. During such processes, layers of gases or thin films are deposited to form a solid insulating or conducting layer on the surface of a wafer. The gases react with material on the substrate thereby creating a thin film that has desirable electrical properties. High-quality films are those with a uniform chemical composition and thickness across the entire substrate area. The thermal process controls the density of the thin film deposited, which is also crucial to the overall wafer quality. Thus, in the interest of improving process yield, there is a desire for an improved heating system that can provide, among other things, greater temperature control (e.g., more independent control zones), and greater temperature uniformity across the wafer surface.

Current heater designs have several fundamental limitations that make performance improvement goals difficult, if not impossible. Limitations and/or challenges have origins in both the heating element of the assembly, the housing thereof, and the relationship for, between and among these primary assembly elements.

Rod-type heaters are large and have flexibility constraints which limit the uniformity of the heating coverage (i.e., there will always be large gaps somewhere in the heating element layout). These same constraints make a rod-heater based high zone count heating system impractical; there isn't enough room to route several pairs of rod-heater ends to and through a chuck/assembly stem or pedestal. Moreover, rod-heaters are not readily heat profiled (i.e., different sections outputting different amounts of power). Although not as limited, wire type heaters are characterized by similar shortcomings.

Etched foil heaters are superior to rod/wire heaters in applications that require temperature uniformity on a flat surface. Etched foil heaters cover a much higher percentage of the heated area and can be profiled to apply more heat near certain features (e.g., holes, edges, etc.). They are also easily made into multi-zone designs.

Be that as it may, etched foil heaters have one major drawback, namely, the electrical insulation (i.e., dielectric) that carries/surrounds the heating element (i.e., the dielectric material/matter interposed between, among, around the foil tracing so as to carry and cover the foil tracing). This electrical insulation layer is also a relatively good thermal insulator which creates a thermal break between opposing housing portions of the assembly. The thermal break permits and commonly results in the housing portions to exhibit dissimilar/disparate thermal profiles/temperatures due to non-uniform thermal loads which are known to contribute to housing warpage due to thermal expansion differences associated with the opposing housing portions.

Thermal properties of assemblies characterized by metal housings and/or plates or the like create a variety of well known material science tensions, note, e.g., the characterization of the problem by Mashima/Mashima et al., US Publ. Nos. 2006/0157472 A1 & 2006/0199135 A1, each of which is incorporated herein in their entireties by reference. Moreover, stainless steel, which enjoy widespread use in semiconductor heat processing, is generally a poor heat conductor. Without multiple independent temperature control zones, unwanted temperature gradients develop, either due to non-uniform heat input or not-uniform heat loss.

While mix and match approaches with regard to material selection in connection to heating and conducting functions are well known and documented, as are numerous approaches to maintain a fixed state for heater assembly elements in furtherance of integrity maintenance, an unmet need for a best of all worlds thermal solution remains for an assembly suitable for controlling the temperature of a workpiece. More particularly, it is believed advantageous and desirable to provide a heater cartridge characterized by an especially efficient heat conducting casing within which operably resides a composite heating element, more particularly, to provide such cartridge wherein interior casing portions are selectively united so as function as heat spreaders, especially in the context of a heater assembly characterized by a stainless steel housing.

SUMMARY OF THE INVENTION

An assembly suitable for controlling the temperature of a workpiece operatively engaged thereby is provided. The assembly generally comprises a housing characterized by first and second housing members sealingly united at their peripheries, or portions thereof, and a heater cartridge enclosed within the housing and compressively retained interior of the sealingly united peripheries of the housing members. The heater cartridge comprises a heat conducting casing characterized by first and second heat conducting casing members and a composite heating element compressively retained between the heat conducting casing members. The first and second heat conducting casing members are selectively united interior of their peripheries, which may be characterized by at least a partial union, so as to delimit heat conduits for the heater cartridge.

The heater cartridge is characterized by high conductivity heat spreaders which form or delimit a heat conducting casing, advantageously, but not necessarily, formed of copper. Select interior portions of a heat conducting member of first and second heat conducting members of the heat conducting casing are adapted, via the inclusion of bosses or the like, to pass through the composite heating element, advantageously but not necessarily, a multi-zone etched foil mica heater, for contacting engagement with the other heat conducting member of the first and second heat conducting casing members so as to thereby delimit heat conducting conduits through the composite heating element for the heat conducting casing. More specific features and advantages obtained in view of those features will become apparent with reference to the drawing figures and DETAILED DESCRIPTION OF THE INVENTION.

BRIEF DESCRIPTION OF THE DRAWINGS

The assembly, subassemblies, apparatus, structures and/or elements disclosed directly or implicitly herein may be embodied in other specific forms without departing from the spirit or general characteristics thereof, some of which forms have been indicated. Thus, the features described and depicted herein/herewith are to be considered in all respects illustrative and not restrictive with the following brief description of the drawings and their content provided.

DETAILED DESCRIPTION OF THE INVENTION

An assembly suitable for controlling the temperature of a workpiece operatively engaged thereby, or supported thereupon, is notionally provided. More particularly, a heater cartridge, having advantageous, non-exclusive utility in connection to semiconductor fabrication, is provided in the context of a compressed heater assembly. For the sake of non-limiting context, a preferred embodiment of the compressed heater assembly takes the form of a compressed heating chuck assembly as shown herein.

Figure 1:
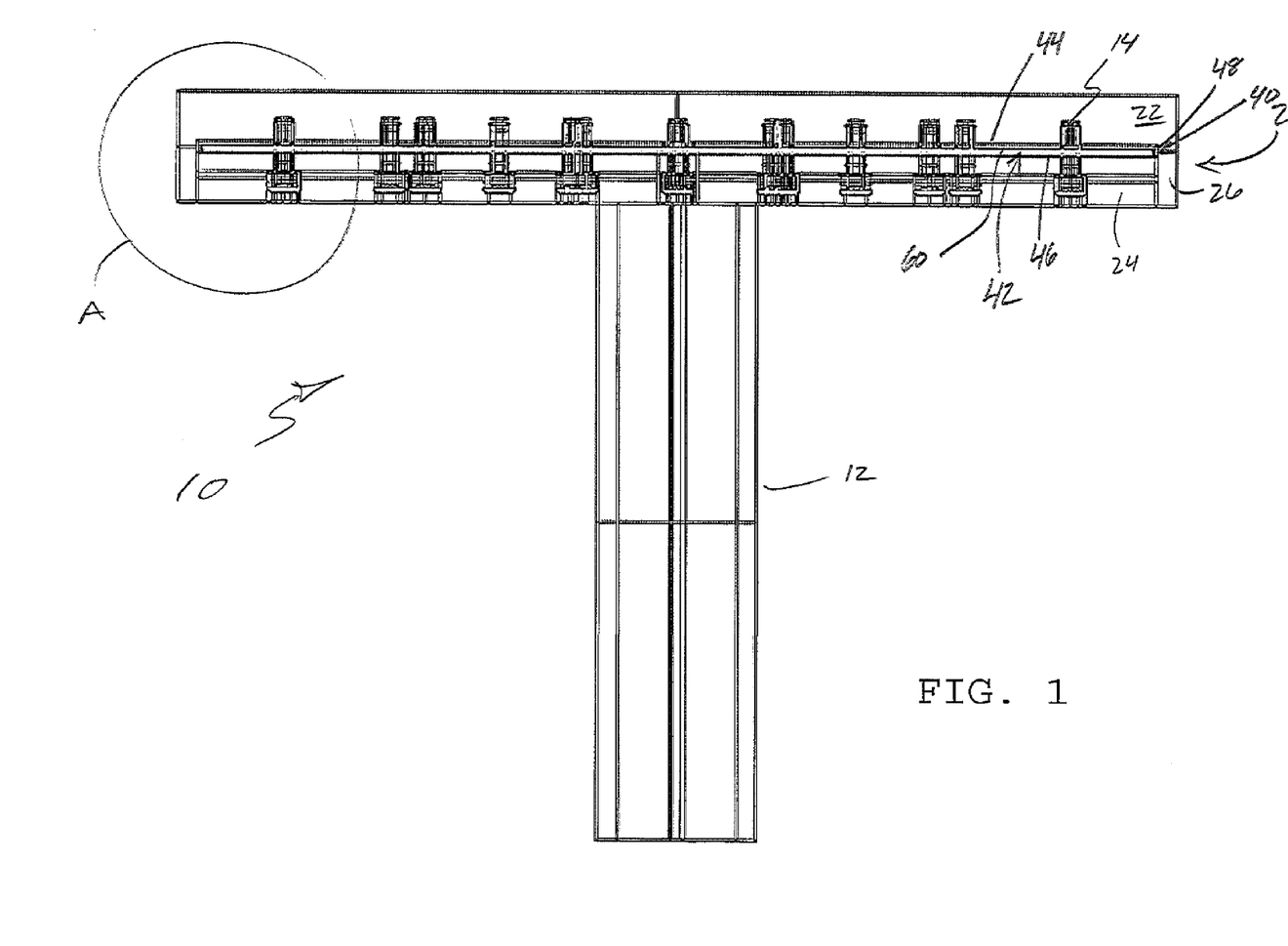
FIG. 1 schematically depicts, transparent elevation view, a representative, non-limiting embodiment of the instant heating assembly in the form of a compressed heating chuck assembly.
Figure 2:
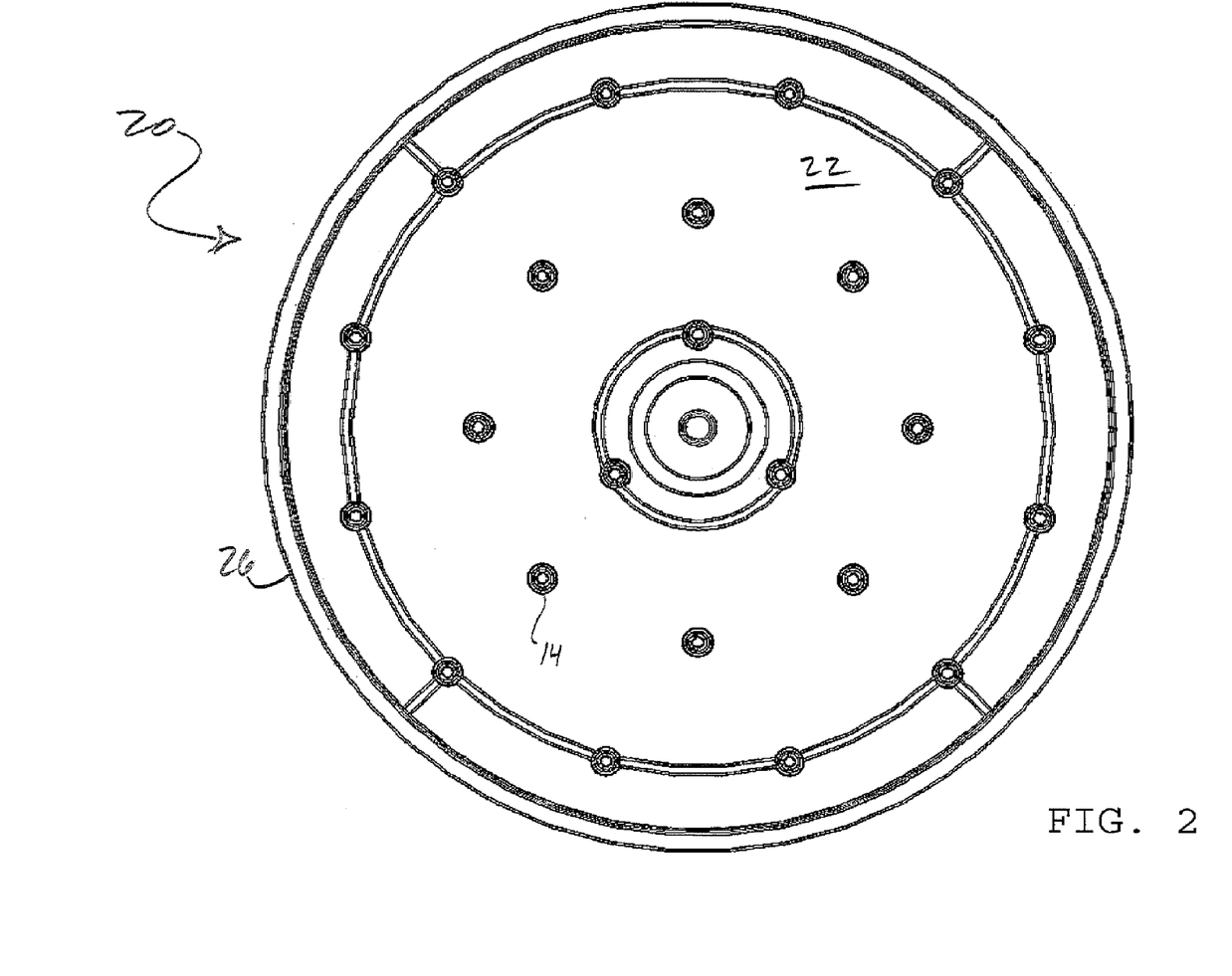
FIG. 2 schematically depicts, plan view from above, a workpiece receiving surface of the heating chuck assembly of FIG. 1.

As a preliminary matter, and with regard to the drawings, a representative compressed heating chuck assembly is generally depicted in the elevation and plan views of FIGS. 1 & 2 respectively. Non-limiting particulars of the assembly (FIG. 3), overall elements of the assembly (FIG. 4), and a preferred, non-limiting composite heating element (FIG. 5) of a heater cartridge of the assembly are generally provided.

Figure 4:
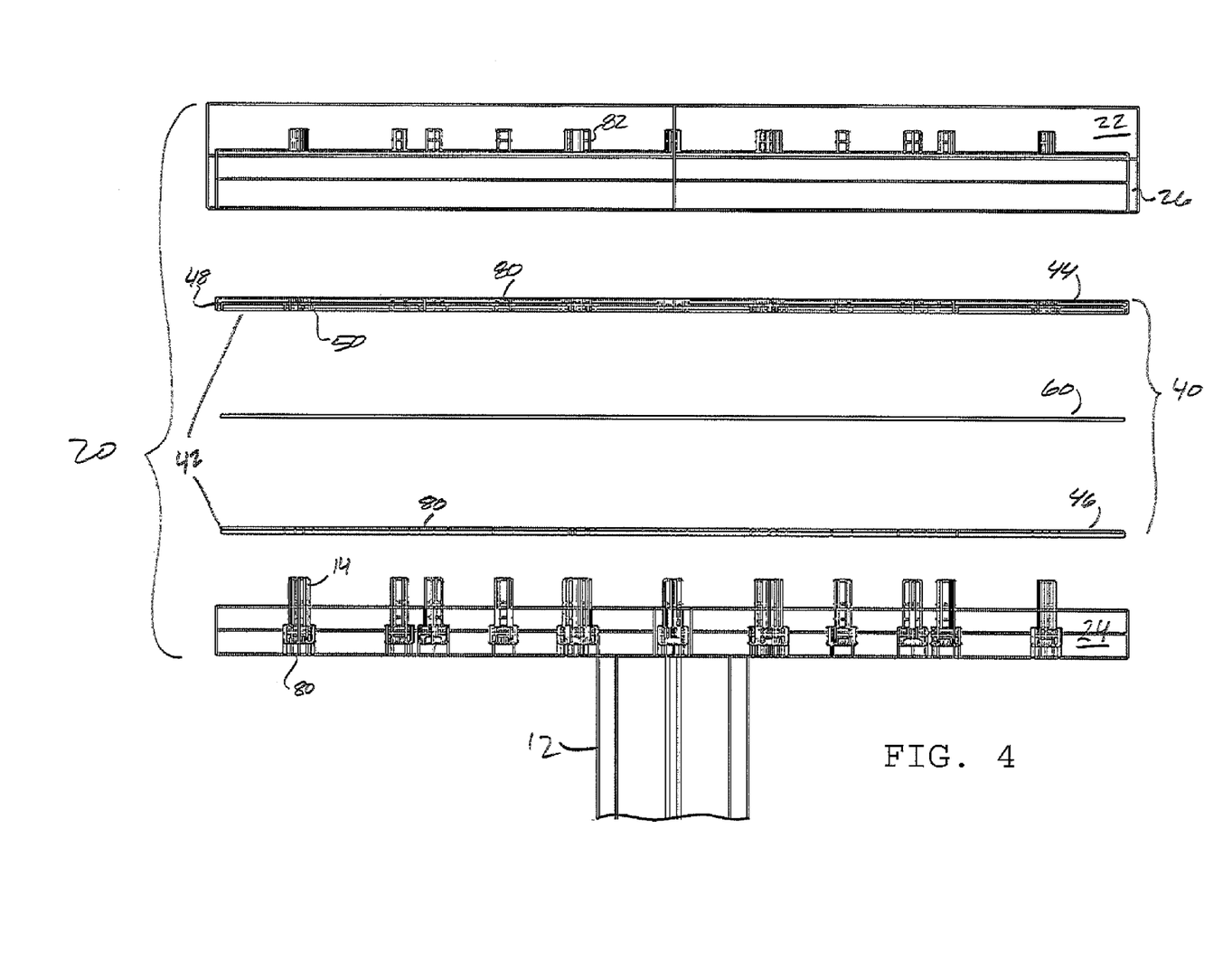
FIG. 4 schematically depicts, exploded view, the assembly housing of FIG. 1; and, FIG. 5 depicts, transparent plan view, a representative, non-limiting representation of a composite heating element of the heater cartridge of FIG. 1.

With general reference to FIGS. 1, 2, & 4, a compressed heater assembly is depicted, more particularly, compressed heating chuck assembly 10. Notionally, and broadly, assembly 10 includes a housing 20, characterized by first 22 and second 24 housing members sealingly united at their peripheries, supported or supportable upon a stem or pedestal 12, and a heater cartridge 40 enclosed within housing 20 and compressively retained interior of the sealingly united peripheries thereof via mechanical means, e.g., via a plurality of threaded fasteners 14 (FIG. 1; representative arrangement as per FIG. 2) which primarily function to retain the assembly elements in a clamped condition, and the application of pressure to further maintain a clamped and compressed union.

As will be subsequently detailed, heater cartridge 40 generally comprises a heat conducting casing 42, characterized by first 44 and second 46 heat conducting casing members, which may be sealingly united at their peripheries or a portion thereof, and a composite heating element 60 compressively retained between heat conducting members 44, 46, via the aforementioned mechanical means as well as via the application of pressure in furtherance of a clamped and compressed union, first 44 and second 46 heat conducting casing members united interior of their peripheries in furtherance of delimiting a plurality of "heat conduits" which physically and thus thermally link the heat conducting casing members at select locals, for instance as shown, in the vicinity of the interposed/interposing mechanical means, in furtherance of enabling enhanced heat spreading throughout the heat conducting casing, and as a result, the assembly housing.

Figure 5:
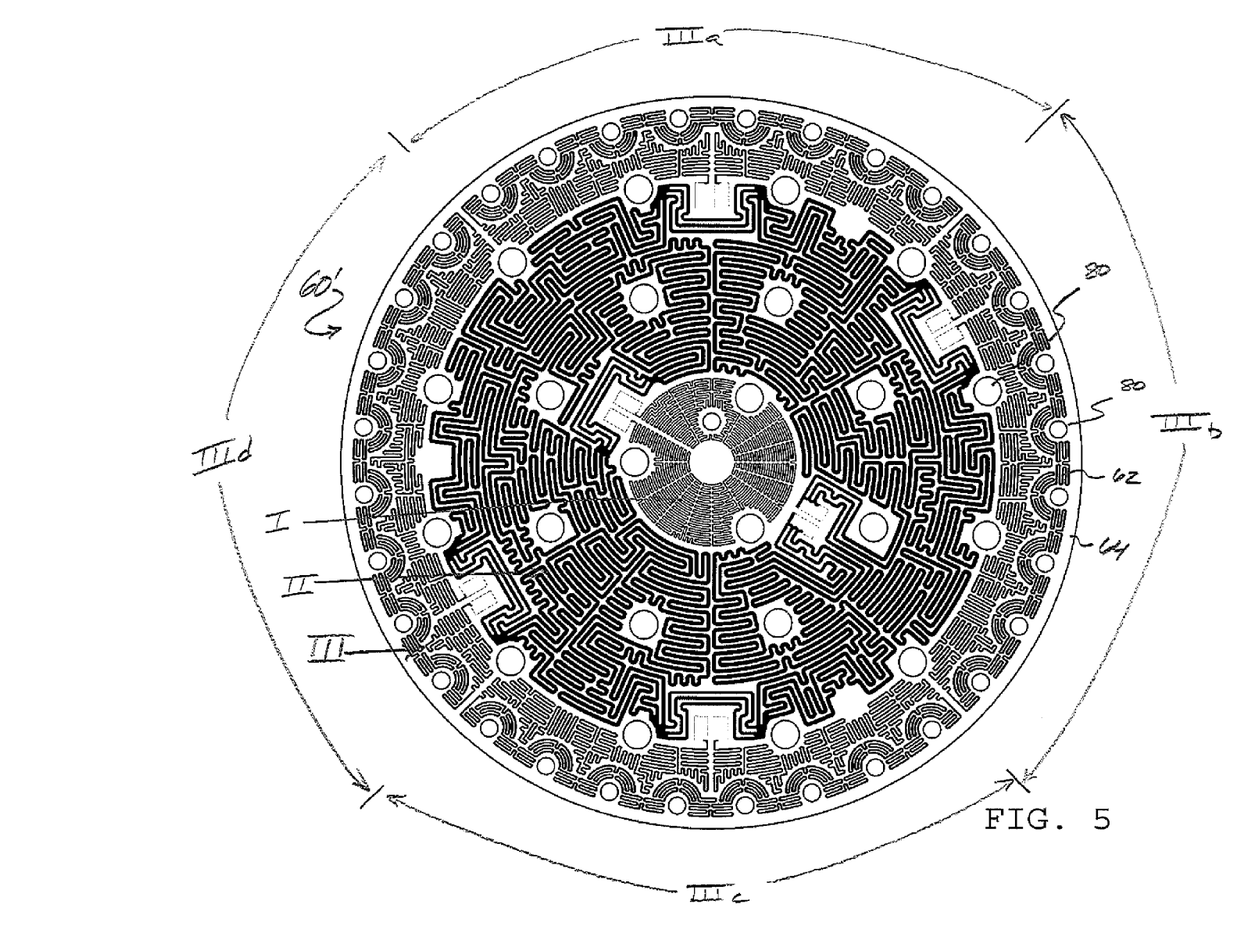

With reference now to FIG. 5, there is generally shown a representative, non-limiting composite heating element possessing particular utility in contemplated preferred embodiments of the instant heater cartridge, more particularly, an etched foil composite heater, and more particularly still, an etched, multi-zone, mica composite heater 60'. Generally, composite heater 60' comprises a selectively patterned etched foil heater element 62, or elements as the case may be, and a mica carrier 64 essentially encapsulating heater element 62. As will be later detailed, to counter the thermal break caused by the insulating mica, and to provide better heat spreading, the mica-insulated heater is encased in a thin (e.g., 0.030"-0.125") copper "shell," i.e., heat conducting casing 42 of heater cartridge 40.

With regard to the heater element, three primary heating regions or zones are generally delimited, namely, zones I, II &

III generally corresponding to concentric rings increasing in circumference as indicated (i.e., inner, outer, and peripheral zones), with four subordinate zones A-D (i.e., zone segments) likewise delimited in connection to peripheral zone III so as to define six separably operable/controllable heating zones. The heating element is provided with a variety of voids or relief areas (i.e., portions or regions wherein tracing is intentionally absent), the voids generally corresponding to/with apertures/through holes 80 passing through composite heater 60' which register with identical or similar apertures/through holes present in heater cartridge casing 42 (i.e., each of first 44 and second 46 heat conducting casing members) to accommodate passage of conduits or mechanical means, e.g., threaded fasteners 14 as shown, which impart/provide, especially in combination with the application of pressure, a requisite compressive or clamping force between, among and for the elements of the assembly which imparts an intimate, substantially coextensive united interface between and among surfaces of primary elements of the assembly.

Figure 3:
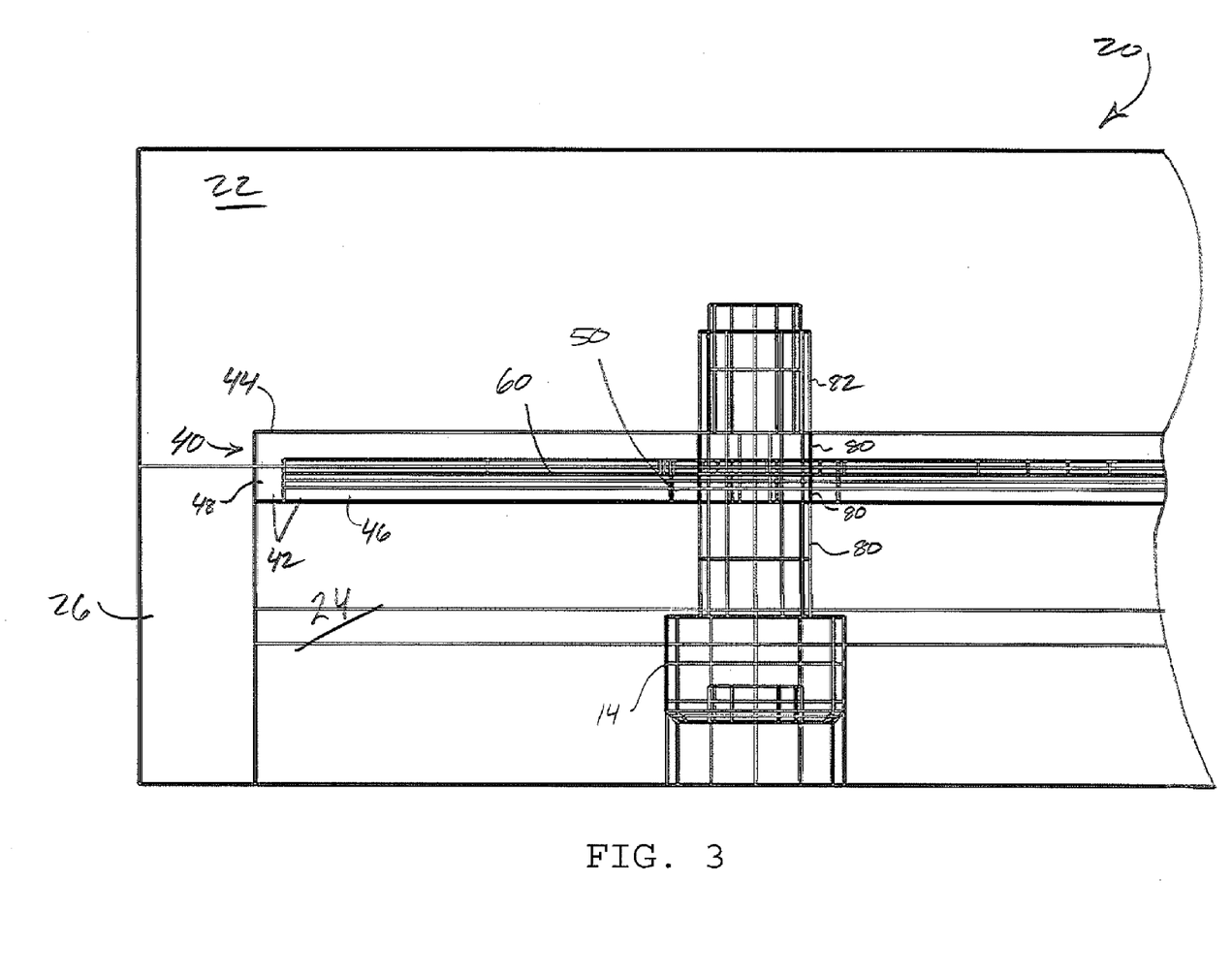
FIG. 3 schematically depicts, enlarged view, peripheral segment "A" of FIG. 1.

With renewed reference to FIGS. 1 & 4, and select reference to FIGS. 2 & 3, particulars of the primary assembly elements are taken up. More particularly, details concerning the assembly housing and heater cartridge thereof are hereinafter provided.

The housing 20 is characterized by first 22 and second 24 housing members, the members sealingly united at their peripheries, or a portion thereof, via conventional means/methods. Advantageously, but not necessarily, one of the generally disc-like members includes a depending peripheral rim 26 so as to delimit a primary housing member or housing "cover" member (FIG. 2) within which the "other," secondary housing member is receivable, compare, e.g., FIG. 1, or FIG. 3, with FIG. 4. Generally, but not exclusively, the housing members comprise aluminum, stainless steel, nickel or alloys thereof, with the mechanical fasteners advantageously of like fabrication. Be that as it may, owing to the relative poor thermal conductance of stainless steel, and it preference in a clean room context or environment, the heater cartridge may best serve assemblies characterized by stainless steel housings vis-a-vis their high conductivity heat spreader arrangement.

One of the housing members, for example a "lower" housing member as per FIG. 4, includes apertures or through holes 80 arranged in a select pattern "P," with the other of the housing members, for example "upper" housing member as per FIG. 4, including cavities 82 arranged in select pattern P. Via such arrangement, and commensurate adaptation of the heater cartridge to likewise include apertures or through holes arranged in select pattern P, and upon registration of select pattern P of the structures so characterized, upper housing member is clampingly urged, throughout its lateral extent, into intimate engagement with "upper" heat conducting casing member of the heater cartridge which in turn is urgingly drawn, throughout its lateral extent, into intimate engagement with the composite heating element, which, owing to the mica thereof has a resilience which aids a contacting interface for the heater in relation to the casing, which in turn is urgingly drawn, throughout its lateral extent, into intimate engagement with "lower" heat conducting casing member of the heater cartridge which in turn is urgingly drawn, throughout its lateral extent, into intimate engagement with lower housing member. Moreover, and as will be particularized with regard to a discussion of the heater cartridge and its elements, the clamped and fixed arrangement so outlined associates corresponding interior, otherwise non contacting portions of each of the first and second heat conducting casing members for direct interior unions (i.e., heat conduits), more particularly, interior unions which circumscribe threaded fasteners passing through the heater cartridge.

The heater cartridge 40 generally comprises heat conducting casing 42 characterized by first 44 and second 46 heat conducting casing members, sealingly united at their peripheries via conventional means/methods, and a composite heating element or heater 60 compressively retained interior of the sealingly united peripheries of first 44 and second 46 heat conducting casing members (e.g., FIG. 4). Advantageously, but not necessarily, the heat conducting case comprises copper, with the copper heat conducting casing members each have a thickness within a range of about 0.030-0.120", with the resulting heater cartridge generally having a thickness in the range of about 0.090-0.280".

The generally disc-like heat conducting case members 44, 46, advantageously, but not necessarily, enjoy a cooperative arrangement as per housing members 22, 24, namely, one of the heat conducting case members includes a depending peripheral rim 48 so as to delimit a primary case member or case "cover" member (FIG. 2) within which the "other," secondary case member is receivable, compare, e.g., FIG. 1, or FIG. 3, with FIG. 4. Moreover, one of the heat conducting case members, more particularly, a surface of opposing surfaces thereof, is adapted to include depending, raised bosses 50, e.g., the case cover member as indicated FIG. 3 or FIG. 4. The bosses, as shown, generally but not necessarily circumscribe the fastener through holes 80 and generally traverse composite heating element 60 via the fastener through holes present in that structure (FIG. 5). Advantageously, but not necessarily, a cross sectional dimension of the boss (i.e., "ring" width) is substantially equivalent to the thickness of the heat conducting case members (i.e., for a given section of the cartridge extending from a select boss, through and to the periphery thereof, the composite heating element will appear uniformly surrounded by the heat conducting material of the casing). Because of the high thermal conductivity of copper (i.e., ~25× stainless steel and ~600× mica) these conduits efficiently conduct heat from one side of the heater to other, and thus maintain temperature uniformity on the top and bottom halves of the overall assembly. To ensure uniform heat transfer, all components within the assembly (e.g., etched-foil heater element, mica insulation, copper and stainless plates) must be maintained in intimate contact.

As to fabrication, the mica insulation is pressure formed around the etched-foil heater element, and the mica surface is machined flat to an overall thickness within a range of about 0.001-0.002". This operation provides a uniform composite heating element thickness, and locks the etched heating element into the mica sheets/lamina. Thereafter, the heat conducting casing members, e.g., copper heat spreaders, are assembled around the composite heating element, compressed and welded at the "heat conduit" locations. Finally, the heater cartridge is assembled into the stainless housing and is compressed, to a face pressure within a range of about 150-250 psi, advantageously, but not necessarily, with a combination of threaded fasteners, and clamping/welding.

The relationship and/or interaction between the copper heat spreaders and the mica insulation is a factor contributing the overall/specific utility of the subject heater cartridge. The mica is semi-compressible, e.g., by about 10%, and provides some rebound force when released, thus helping to ensure that the copper is always in contact with the stainless steel, even if there are some minor machining irregularities. As is readily appreciated, the copper must be thick enough to spread the heat efficiently but it must be thin enough so the mica rebound force can keep it tightly against the stainless steel outer shell.

While temperature uniformity is a primary objective for/of the instant heater, alternate thermal performance goals are achievable and contemplated. By way of non-limiting illustration, several observations with regard to the composite heating element, the cartridge casing, and the housing generally follow.

As to the composite heating element, via etched element profiling, the power distribution can be varied across the heater surface to account for non-uniform heat loss or to create a desired temperature profile. Moreover, in connection to multi-zone control, the etched pattern may easily be broken into smaller independent zones which provide more accurate control in variable heat loss environments. Further still, the mica thickness ratio, more particularly the top-bottom mica thickness ratio, can be varied to drive more heat to either the top or bottom surface of the composite heating element.

As to the cartridge casing, the copper heat spreader thickness can be varied to achieve select temperature uniformity and/or select independent zone controllability. Moreover, the copper heat spreaders can be selectively perforated or thinned, e.g., as by grooving or the like, to reduce or limit heat transfer in select cartridge areas or regions, for instance, to minimize influence from nearby independent control zones and/or in furtherance of addressing/overcoming the shortcomings of end effects at the periphery of the structure/element. Further still, the size, shape, configuration, number and local of the heat conduits may be readily adapted in furtherance of select vertical heat transfer between the top and bottom composite heating element surfaces. Finally, as to the housing casing, it too may be readily adapted for select overall or regional heat transfer via the inclusion of thermal breaks, generally, but not necessarily, in the form of the select localized removal of material.

Since the structures of the assemblies, subassemblies, and/or mechanisms disclosed herein may be embodied in other specific forms without departing from the spirit or general characteristics thereof, some of which forms have been indicated, the embodiments described and depicted herein/with are to be considered in all respects illustrative and not restrictive. Moreover, while nominal processing has been described and detailed, and to some degree alternate work pieces and systems, assemblies, etc. with regard thereto referenced, contemplated processes are not so limited. Accordingly, the scope of the subject invention is as defined in the language of the appended claims, and includes not insubstantial equivalents thereto.

That which is claimed:

1. An assembly for controlling a temperature of a workpiece operatively engaged thereby, the assembly comprising:
    a. a housing characterized by first and second housing members sealingly united at their peripheries and operatively united interior of their peripheries;
    b. a heater cartridge enclosed within said housing and compressingly retained interior of said sealingly united peripheries of said first and second housing members, said heater cartridge comprising a heat conducting casing characterized by first and second heat conducting casing members and an etched foil heating element compressingly retained between said first and second heat conducting casing members, one heat conducting casing member of said first and second heat conducting casing members adapted to include a plurality of bosses, bosses of said plurality of bosses circumscribing through holes of a plurality of through holes in said heater cartridge, said bosses passing through said single etched foil heating element for engagement with another heat conducting casing member of said first and second heat conducting casing members; and,
    c. a plurality of mechanical fasteners for compressingly retaining said heater cartridge interior of said sealingly united peripheries of said first and second housing members and said etched foil heating element between said first and second heat conducting casing members, mechanical fasteners of said plurality of mechanical fasteners extending from one of said first or said second housing members of said housing to and through one of said first or said second heat conducting members of said heater cartridge, said etched foil heating element, another of said first or said second heat conducting members of said heater cartridge and into another of said first or said second housing members of said housing, said bosses thereby conducting heat produced by said single etched foil heating element from said one heat conducting casing member of said heater cartridge to said another heat conducting casing member of said heater cartridge so as to improve temperature uniformity on top and bottom halves of the assembly.

2. The assembly of claim 1 wherein said heat conducting casing comprises copper or an alloy thereof.

3. The assembly of claim 1 wherein said housing comprises stainless steel and said heat conducting casing comprises copper or an alloy thereof.

4. The assembly of claim 1 wherein each of said first and second housing members and said heater cartridge are adapted to operably receive said plurality of mechanical fasteners so as to compressingly unite said heater cartridge between each of said first and second housing members.

5. The assembly of claim 1 wherein a housing member of said first and second housing members and said heater cartridge each include a select arrangement of through holes for receipt of mechanical fasteners of said plurality of mechanical fasteners which operably unite in binding tension.

6. The assembly of claim 1 wherein either or both of said first and second heat conducting casing members of the heat conducting casing of the heater cartridge are adapted to have a varied or variable thickness.

7. The assembly of claim 1 wherein either or both of said first and second heat conducting casing members of the heat conducting casing of the heater cartridge are selectively thinned.

8. The assembly of claim 1 wherein either or both of said first and second heat conducting casing members of the heat conducting casing of the heater cartridge are selectively perforated.

9. The assembly of claim 1 wherein said etched foil heating element comprises an etched multi-zone composite heater.

10. The assembly of claim 1 wherein said etched foil heating element comprises an etched multi-zone composite heater, each zone of said multi-zone composite heater corresponding to concentric rings of increasing circumference.

11. The assembly of claim 10 wherein said each zone of said multi-zone composite heater is characterized by multiple segments, each segment of said multiple segments comprising a circular sector.

12. The assembly of claim 1 wherein heat conducting casing members of said first and second heat conducting casing members of said heat conducting casing are characterized by a thickness within a range of about 0.03-0.125 inches.

13. The assembly of claim 1 wherein a heat conducting casing member of said first and second heat conducting casing members includes a depending peripheral rim.

14. The assembly of claim 1 wherein a housing member of said first and second housing members includes a depending peripheral rim.

15. The assembly of claim 1 wherein said housing comprises any of aluminum, stainless steel, nickel or alloys thereof.

16. The assembly of claim 1 wherein said bosses have a cross sectional dimension substantially equivalent a thickness of a heat heat conducting casing member of said first and second heat conducting casing members.

17. The assembly of claim 1 wherein mechanical fasteners of said plurality of mechanical fasteners comprise threaded fasteners.

\* \* \* \* \*